United States Patent
Boyer et al.

(10) Patent No.: US 6,401,930 B1
(45) Date of Patent: Jun. 11, 2002

(54) UNIVERSAL HANDLING CONTAINER

(75) Inventors: Thomas Boyer, Gambrills, MD (US); Keith Chandler, Lawrenceville, GA (US); Lance Barley, Glen Burnie; Melvyn Leeb, Owings Mills, both of MD (US)

(73) Assignee: Ciena Corporation, Linthicum, MD (US)

( * ) Notice: Subject to any disclaimer, the term of this patent is extended or adjusted under 35 U.S.C. 154(b) by 0 days.

(21) Appl. No.: 09/732,842

(22) Filed: Dec. 8, 2000

(51) Int. Cl.$^7$ .............................................. B65D 85/30
(52) U.S. Cl. .................... 206/721; 206/723; 206/594
(58) Field of Search ................ 206/721–724, 206/521, 523, 459.5, 591, 592, 594; 220/4.21, 4.22, 4.23, 495.01; 229/108, 110, 117.27

(56) References Cited

U.S. PATENT DOCUMENTS

| | | | |
|---|---|---|---|
| 3,344,973 A | * 10/1967 | Studen | 206/523 |
| 4,241,829 A | 12/1980 | Hardy | |
| 4,593,339 A | 6/1986 | Robinson | |
| 4,711,350 A | 12/1987 | Yen | |
| 4,915,222 A | 4/1990 | Reidinger et al. | |
| 4,953,705 A | * 9/1990 | Evamy | 206/594 |
| 4,966,280 A | 10/1990 | Bradford | |
| 5,323,898 A | 6/1994 | Kester | |
| 5,375,709 A | 12/1994 | Petro | |
| 5,738,219 A | * 4/1998 | Arsena et al. | 206/723 |
| 5,906,281 A | * 5/1999 | Fujikawa et al. | 206/721 |
| 5,958,212 A | * 9/1999 | Yamamura et al. | 205/723 |
| 6,220,442 B1 | * 4/2001 | Merrell et al. | 206/721 |

* cited by examiner

*Primary Examiner*—Luan K. Bui
(74) *Attorney, Agent, or Firm*—Michael R. Cammarata

(57) ABSTRACT

A universal handling container is disclosed that protects ESD sensitive items from physical damage and electrostatic discharge (ESD). The universal handling container is primarily intended as a temporary housing solution such as during the manufacturing or assembly of ESD-sensitive items which often require transportation between assembly stations and for temporary storage. The universal handling container includes a box constructed with a structural conductive material such as conductive corrugated plastic and has a base section, a hinge section and a lid section. The base and lid sections are lined with conductive resilient panels to increase the ESD shield integrity and provide a cushioning effect to protect against physical damage. The universal handling container may shaped like a decahedron with a base section that may be divided into a main section having a rectangular parallel piped shape and a pair side sections having a hexahedron shape on opposite sides of the rectangular parallel piped. The side sections are filled with conductive blocks each of which has a recess formed in a top surface thereof. The recesses accept conductive projections affixed to an inside surface of the lid section to form a closure mechanism that not only holds the container closed but also provides excellent conductivity between the base and lid sections thereby ensuring a good Faraday cage effect. A document holder may be affixed to the top of lid section to hold documents identifying the contents. Adapter blocks may be used to fill voids between the ESD-sensitive item and the container.

15 Claims, 8 Drawing Sheets

UNIVERSAL HANDLING CONTAINER

BACKGROUND OF THE INVENTION

1. Field of Invention

The invention relates to handling containers for use in an assembly or manufacturing environment. The invention more particularly relates to a universal handling container that temporarily protects an ESD (electrostatic discharge) sensitive item such as an electrical or electro-optical module.

2. Description of Related Art

ESD-sensitive items such as electrical and electro-optical modules present difficult challenges to a packaging engineer. Such modules include one or more circuit boards with various electrical, optical, and/or electro-optical components. Such modules are quite fragile and should be adequately protected during shipping, servicing, or at an other time when the module is not located within a permanent or other protective container. The types of protection required by such modules include physical protection and ESD (electrostatic discharge) protection.

Many manufacturers of such modules utilize a permanent container to house sensitive boards having electrical, optical, and/or electro-optical components. For example, a common solution is to use a sheet metal housing to fully enclose the board(s).

While a sheet metal container does provide a measure of physical and electrostatic discharge (ESD) protection, such permanent containers create their own problems. Chief among these problems is heat dissipation. By enclosing the board(s) within a sheet metal container, thermal mass increases and, perhaps more significantly, airflow is restricted. Thus, the heat generated by the components is much harder to dissipate and may contribute to component failure, degradation and shortened life-span. Openings, holes and fans are often added to cool the components but such techniques are often inadequate.

Another problem of permanent containers is that they consume valuable space. A common goal in the electronics and opto-electronics industries is to produce modules of minimum size. The permanent container solution consumes space and defeats this goal. Moreover, the permanent container adds a level of complexity and cost to a module which can be a serious disadvantage in an industry having narrow profit margins.

Another common solution is to dispense with a permanent housing altogether. This creates shipping and temporary storage problems for the unprotected module. As noted above, the module is subject to physical damage as well as ESD damage from improper handling.

Various temporary module packing designs are commercially available to solve these problems. A typical design is a plastic clamshell enclosure in which two plastic panels with a common hinge may be closed in a clamshell fashion to house a module. The plastic panels usually have an cavity that conforms to the exterior dimensions of the module being housed. Such clamshell enclosures are quite flimsy and fail to adequately protect the module being housed. To provide the necessary physical protection such clamshell enclosures are themselves enclosed in other protective packaging materials particularly during shipping. This adds bulk, expense and may contribute to ESD problems particularly if electrically insulative packaging materials are used.

Suspension packaging is another conventional packing design widely used in the industry. Such suspension packages include two frames each of which holds a sheet of resilient material such as thin plastic. The module is put between the two frames which are then brought together thereby trapping the module between the resilient sheets. The space between the module and external box housing the frames provides a measure of physical protection but this measure may not adequate to protect the module. In addition, the plastic sheets and paper materials used are typically insulative and create ESD problems which can damage the components of the module.

Furthermore, suspension packaging is cumbersome and bulky and is not likely to be utilized by a technician or assembler seeking a temporary home for the module. For example, such suspension packages are typically used only for shipping and are thrown away after shipping due to their bulk and not available for a temporary housing solution.

During manufacture and assembly of ESD-sensitive modules the temporary housing issue is acute. Regardless of whether a permanent container will be used or not, during the manufacture and assembly the module is often transported between different locations of the manufacturing floor or building(s). Even in a tightly controlled environment in which, for example, assemblers wear ESD preventative clothing and devices and the floor is embedded with a conductive wires, ESD can still damage modules. The shipping solutions described above are intended for long-distance shipping and require many steps to fully package the ESD-sensitive item. As such, conventional shipping solutions are not appropriate for a manufacturing environment in which rapid and efficient access to the module is important.

Therefore, there is a need for a housing container that solves the above-identified and other problems in the industry.

SUMMARY OF THE INVENTION

A universal handling container is disclosed that provides a temporary housing for ESD-sensitive items such as electrical and electrooptic components and modules.

The inventive universal handling container for housing an ESD-sensitive component, includes: a base section including a bottom, a front, and a back; a lid section having a shape substantially conforming to a shape of the bottom of the base section; a hinge section joining the back of the base section and the lid section; wherein an interior of the said base section has a shape divided into a middle portion and a pair of side portions on opposite sides of the middle portion; panels lining an interior face of the lid section and interior faces of the bottom, front and back of the base section; blocks substantially filling the two side portions of said base section; a pair of recesses provided in top portions of said blocks; and a pair of projections affixed to the interior face of the lid section and opposite the pair of recesses; the pair of recesses and said pair of projections having a shape and size so as to form a friction fit therebetween; the base section, the lid section, and the hinge section being made of a conductive material; and the panels, the blocks, and the projections being made of a conductive, resilient material.

The lid section and the bottom of the base portion may both have an octagonal shape such that the interior of the base section has an decahedral shape, the middle portion has a rectangular parallel piped shape and the two side sections each have a hexahedral shape.

The front and the back of the base section may each have a rectangular main surface and a pair of wings disposed on opposite ends of the rectangular main surface, the wings being bent inwardly to conform to the octagonal shape of said lid section and the bottom of said base section.

In addition, a document holder having at least a top surface made of a transparent material may be affixed to an outer surface of the universal handling container.

Also, a conductive adapter may be included having a size and shape to adapt interior dimensions of the universal handling container to exterior dimensions of the ESD-sensitive component.

Conductive materials such are preferably used to construct the container in order to have the desired Faraday cage effect. Specifically, the outer shell of the container is preferably made of a structural conductive material such as conductive corrugated plastic. This shell is lined with a conductive resilient material to cushion the ESD-sensitive item and to increase the effectiveness of the Faraday cage. For example, the panels, blocks, and projections may be made from a closed-cell conductive foam, a conductive cross-linked polyethylene foam or a conductive cross-linked VA copolymer foam.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

Figure 1:
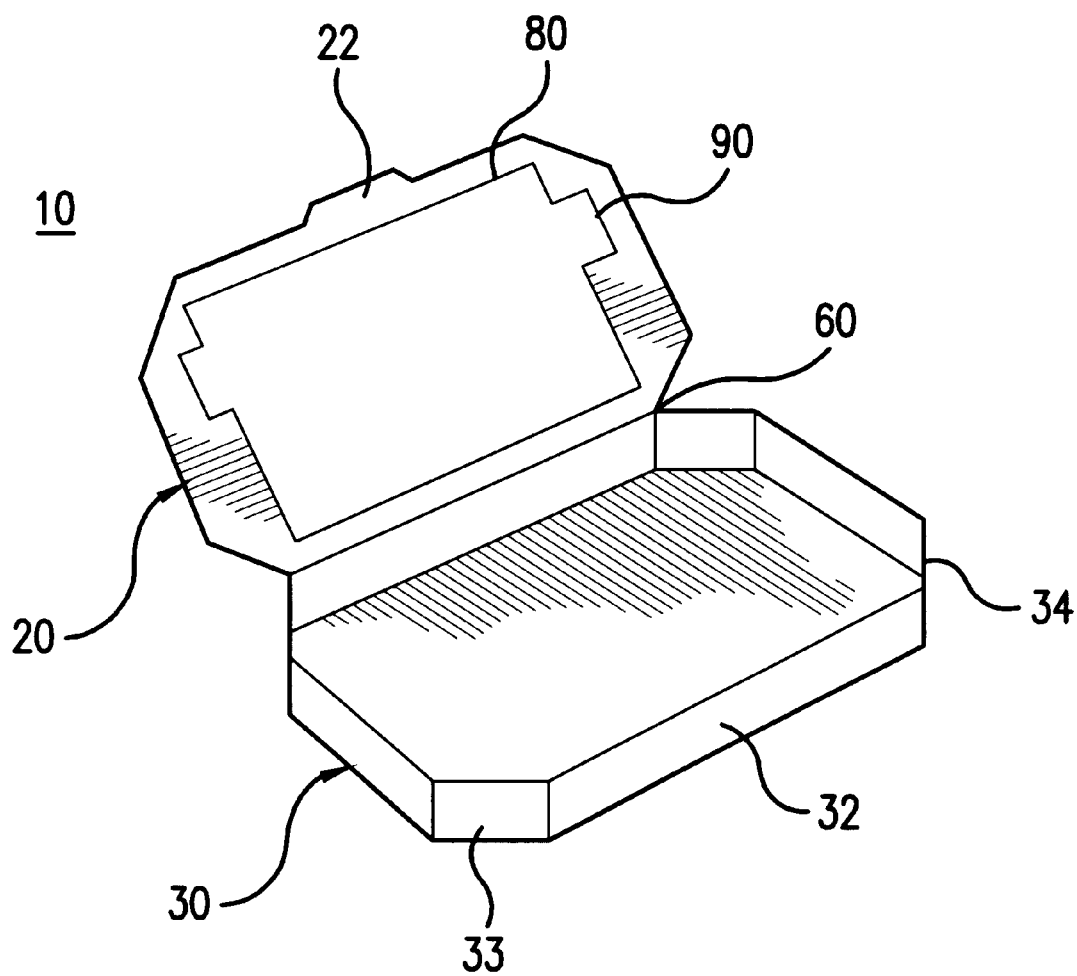
FIG. 1 is a perspective drawing showing the inventive universal handling container.

FIG. 1 illustrates the inventive universal handling container 10 in perspective view. The handling container 10 may have a box-like shape as illustrated including a lid section 20, a base section 30, a hinge section 60.

The box-like shape of the handling container 10 is chosen to conform to a variety of exterior shapes of the ESD-sensitive component(s) or module(s) to be housed. Since many such ESD-sensitive components are circuit boards having a rectangular shape, the general shape of the handling container is also preferably rectangular. It is to be understood that the handling container 10 may be adapted to the exterior shape of the particular ESD-sensitive item. This includes adapting the relative dimensions as well as the overall shape of the handling container 50.

Figure 2:
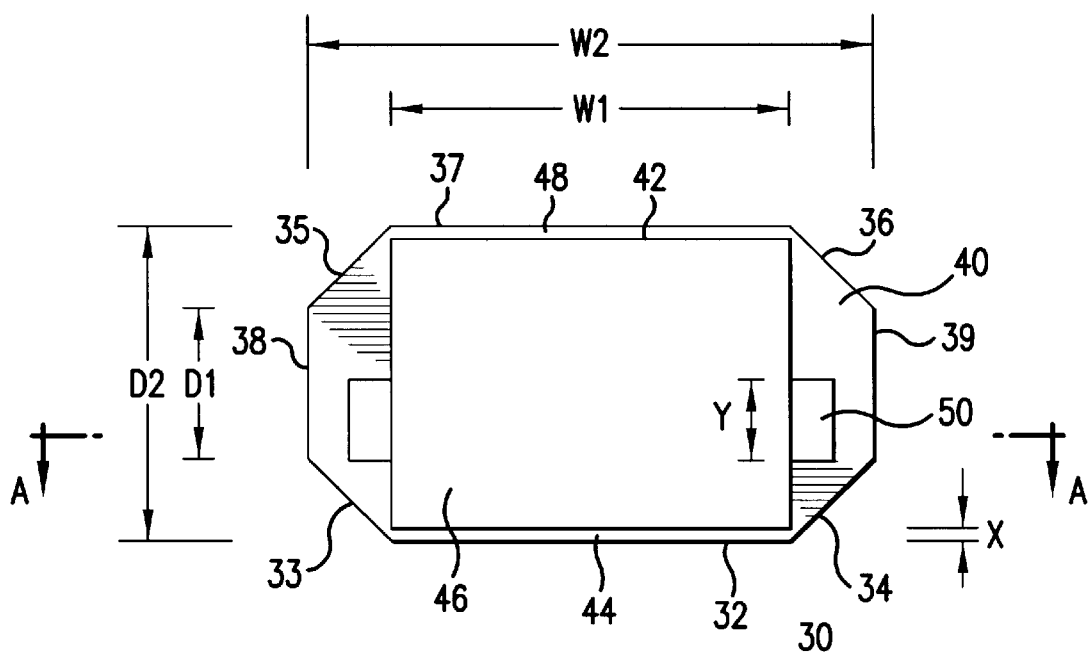
FIG. 2 is a top view showing the inventive universal handling container's base section and cross section line A—A.

Although the handling container 10 may take on a variety of shapes, the preferred shape is shown in the figures. As illustrated in FIGS. 1 and 2, the base section 30 may have a front 32; back 37; bottom 31; and sides 33, 34, 35, 36, 38, 39. The top of base section 30 is left open.

The most preferred shape for the handling container 10 is a box-like shape in which the top section 20 and bottom 31 of base section 30 have an octagonal shape. In other words, base section 30 is shaped such that the interior volume of base section 30 may be divided into a middle portion (of width W1) and a pair of side portions (of width W2-W1) on opposite sides of the middle portion, the middle portion having a rectangular parallel piped shape and the two side sections each have a hexahedral shape.

The lid section 20, hinge section 60 and base section 30 (including front 32; back 37; bottom 31; and sides 33, 34, 35, 36, 38, 39) are preferably constructed with a conductive, structural material such as conductive, corrugated plastic. Indeed, the entire outer structure of the handling container 10 may be constructed from a single sheet of conductive, corrugated plastic by cutting, bending and creasing the sheet as is known in the art. The hinge section 30 may be conveniently and advantageously formed by merely bending the sheet such that no gaps that would permit ESD to enter the container 10 are formed.

The interior faces of lid section 20 and base section 30 are lined with a conductive resilient material such as conductive foam or rubber. Specifically and as shown in FIG. 2, the base section 30 is lined with panels of conductive resilient material including a bottom panel 46, front panel 44, and back panel 48. The bottom panel 46 may extend to cover the entire inside surface of base section bottom 31 or it may only cover the middle section. The inside surface of lid section 20 is also lined with a panel 80 of conductive resilient material.

Figure 3:
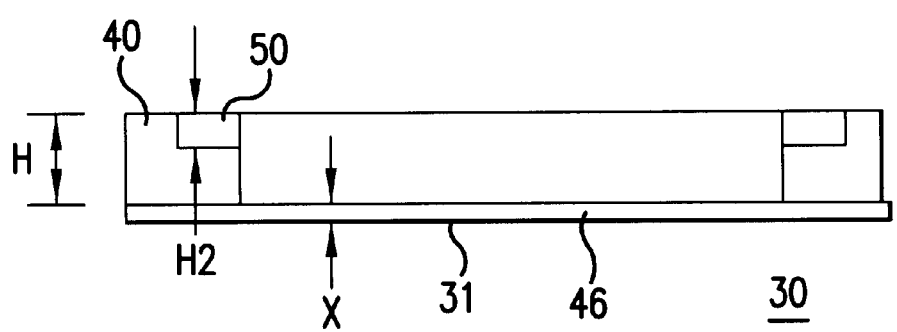
FIG. 3 is a cross-sectional view taken along cross section line A—A of the inventive universal handling container's base section.
Figure 4:
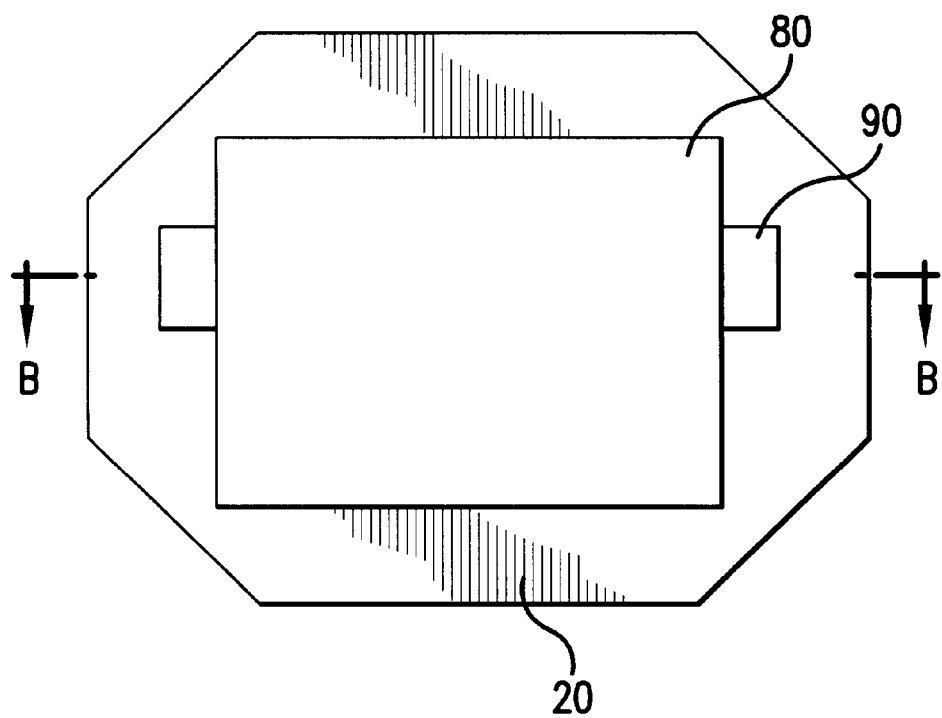
FIG. 4 is a top view showing the inventive universal handling container's lid section and cross section line B—B.

The panels 44, 46, 48, 80 have a thickness X (shown in FIGS. 2 and 3). To ease in the manufacturing process, the same thickness X is used for all of the panels 44, 46, 48, 80. In other words, a common blank sheet of thickness X may be used to form all of the panels 44, 46, 48, 80 and thereby simplify manufacturing and reduce cost.

As shown in FIGS. 2 and 3 blocks 40 fill the side portions of base section 30. The blocks 40 are preferably constructed from a conductive resilient material. If the preferred shape of handling container is utilized, then the blocks 40 will have a hexahedral shape. Recesses 50 are formed in top sections of each block 40. As shown in the cross-sectional drawing of FIG. 3, the recesses 50 extend for a height H2 that is preferably less than the height H1 of the base section 30.

Figure 9:
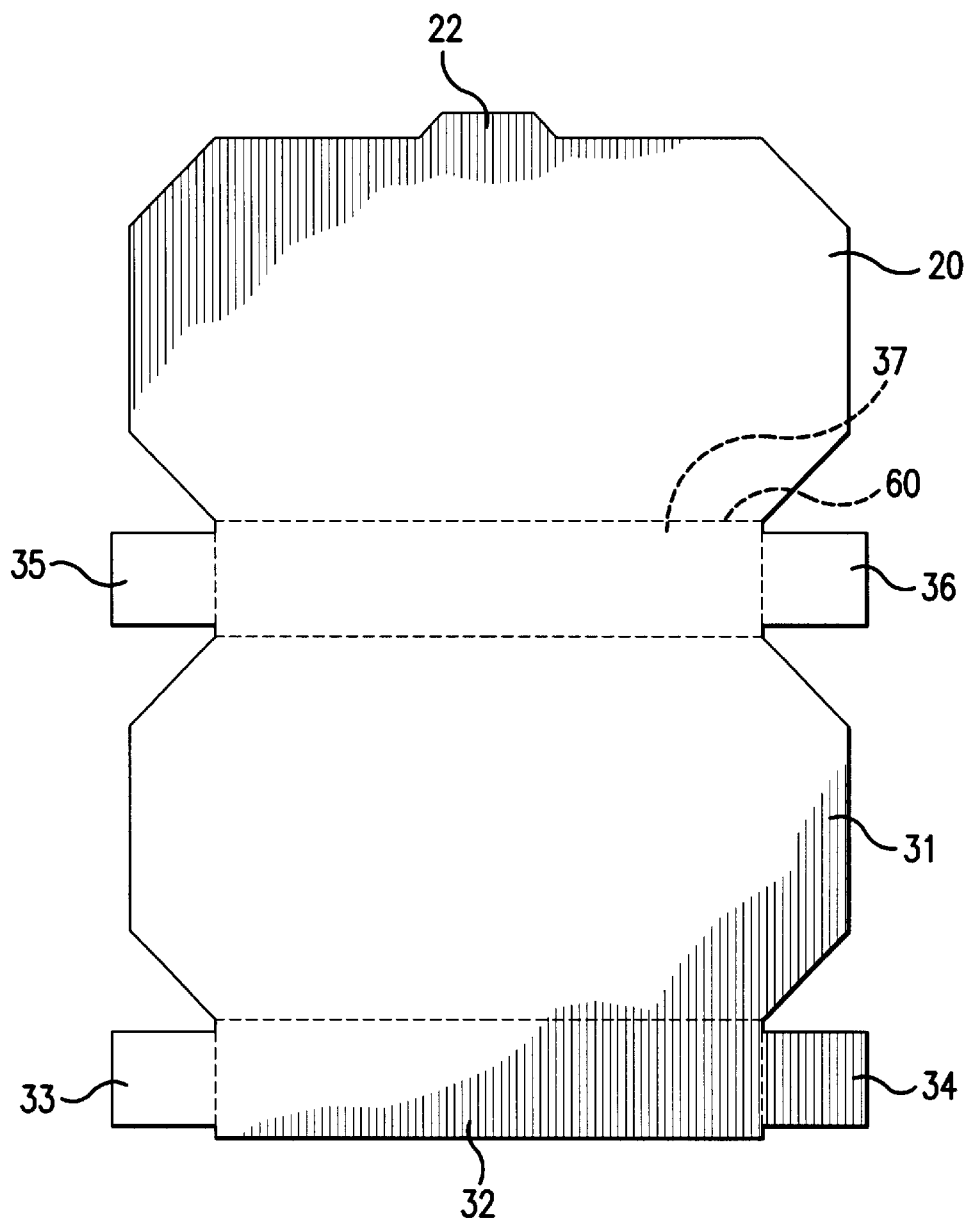
FIG. 9 is an exploded view of the inventive universal handling container.

Although the base section 30 may have sides 32, 33, 34, 35, 36, 38 and 39 it is also possible to eliminate sides 38 and 39 as illustrated in FIGS. 1 and 9. Specifically, the front 32 of base section 30 may have a rectangular main surface (front 32) and a pair of wings (sides 33 and 34) disposed on opposite sides of the rectangular main surface 32, the wings being bent inwardly to conform to the octagonal shape of the lid section and bottom of the base section. Similarly, the back 37 of base section 30 may have a rectangular main surface (back 37) and a pair of wings (sides 35 and 36) disposed on opposite sides of the rectangular main surface 37, the wings being bent inwardly to conform to the octagonal shape of the lid section and bottom of the base section.

With this design, it is not necessary to form sides 38 and 39 with those sides 38 and 39 being left open. The open space of sides 38 and 39 may be filled with the blocks 40 that fill the side portions of base section 30. In this way, a material cost savings may be achieved and the structural rigidity not significantly compromised.

It is also possible to eliminate surfaces 33, 34, 35 and 36 in addition to eliminating surfaces 38 and 39. The open spaces left by eliminating these surfaces may be filled with the blocks 40 to complete the Faraday cage and close the container 10.

FIG. 9 further illustrates a preferred construction for the handling container. Specifically, FIG. 9 is an exploded view showing how the external shell of the handling container 10 may be constructed from a single sheet of material. In the design shown in FIG. 9, the sides 38 and 39 are eliminated.

Figure 5:
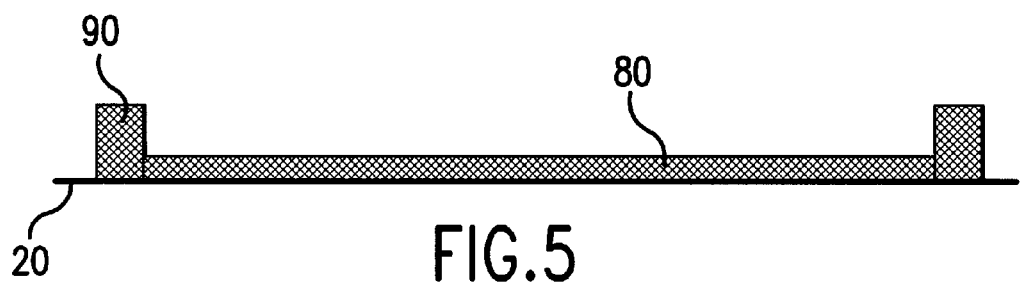
FIG. 5 is a cross-sectional view taken along cross section line B—B of the inventive universal handling container's lid section.

The handling container 10 also includes an advantageous closure mechanism. The closure mechanism includes a pair of projections 90 affixed to an inside surface of the lid section 20. FIG. 5 illustrates this pair of projections 90 in cross-section. The pair of projections 90 are provided opposite to the pair of recesses 50 formed in the blocks 40 of each side portion of the base section 30. The pair of projections 90 and pair of recesses 50 are preferably shaped and sized so as to form a friction fit therebetween. Such a friction fit will ensure a sound electrical connection between the base section 30 and the lid section 20 and thereby help complete the Faraday cage. Indeed, there is a large mating surface area that aids the Faraday cage effect. This friction fit between projections 90 and recesses 50 also holds the lid section 20 in the closed position.

Figure 6:
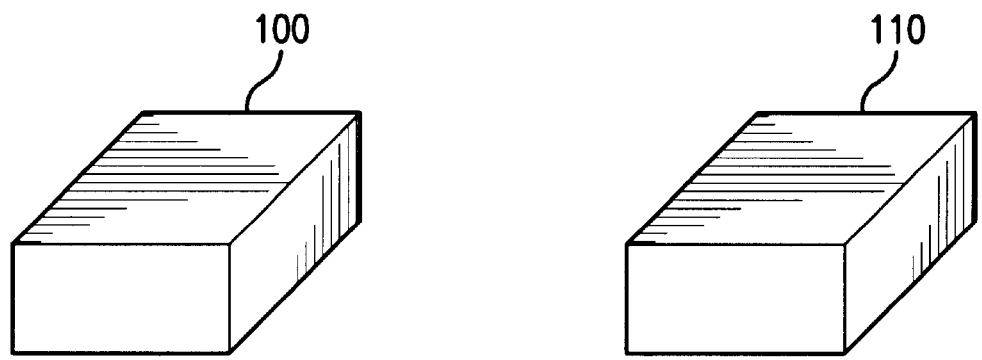
FIG. 6 is a perspective view of optional conductive adapter blocks according to the to invention.

FIG. 6 illustrates adapters 100, 110 that may be used with the handling container 10. As mentioned above, the size and shape of the handling container 10 is preferably universal in that it may accommodate a variety of ESD-sensitive items of different sizes. As such, the interior volume of the handling container 10 may be much larger than the size of the ESD-sensitive item to be housed. In that situation, the adapters 100, 110 may be employed to take up any slack in the interior volume. In other words, the adapters 100, 110 preferably have a shape and size to adapt interior dimensions of the handling container 10 to exterior dimensions of the ESD-sensitive items.

Although FIG. 6 show the adapters 100, 110 to have the same rectangular parallel piped shape, it is quite possible to use different shapes and sizes. Indeed, a variety of such adapters 100, 110 of varying shapes and sizes may be used to adapt different ESD-sensitive items to the same universal handling container 10. The adapters 100, 110 are considered to be an optional feature of the invention finding most utility when the shapes and sizes of the ESD-sensitive items expected to be housed in variable.

Figure 7:
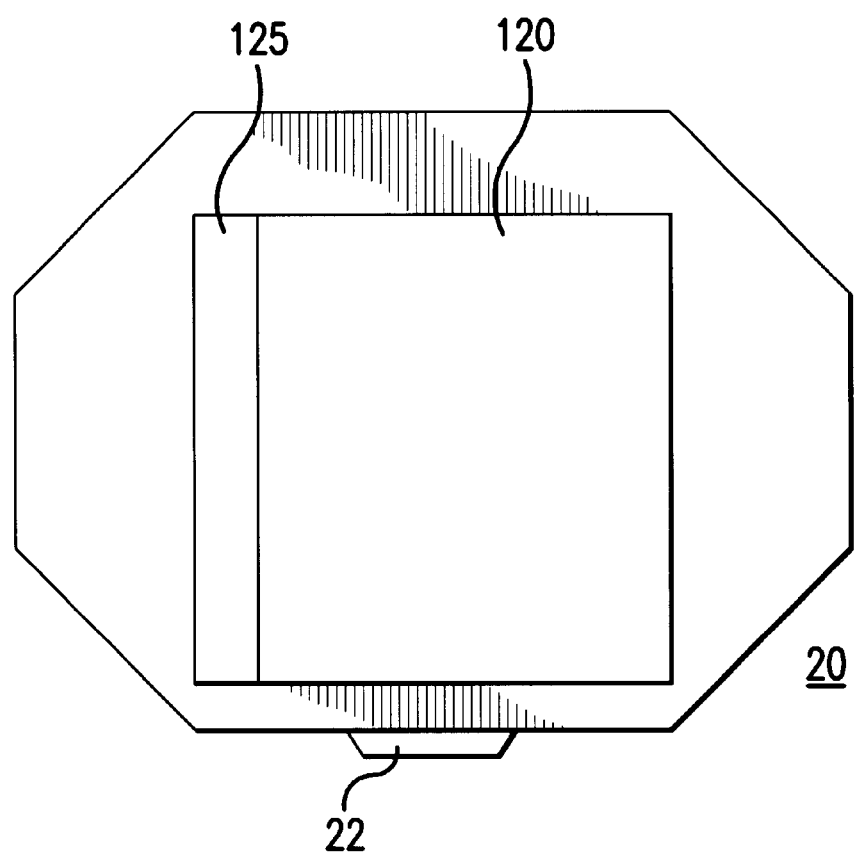
FIG. 7 is a top view showing the inventive universal handling container's lid section with optional document holder.

FIG. 7 shows another alternative of the invention which is a document holder 120. To provide the best protection against ESD, the handling container 10 must be kept closed. A common reason for opening a container is to find out what is inside. To reduce the number of such openings and thereby enhance the ESD protection, the document holder 120 is provided. Document holder 120 holds documents such as an identification of the ESD-sensitive item inside of the handling container 10. The document holder 120 is preferably made from a transparent conductive material. and may include a top document holder layer 120 and bottom layer 125 larger than the top layer to aid insertion of the document into the holder 120.

Figure 8:
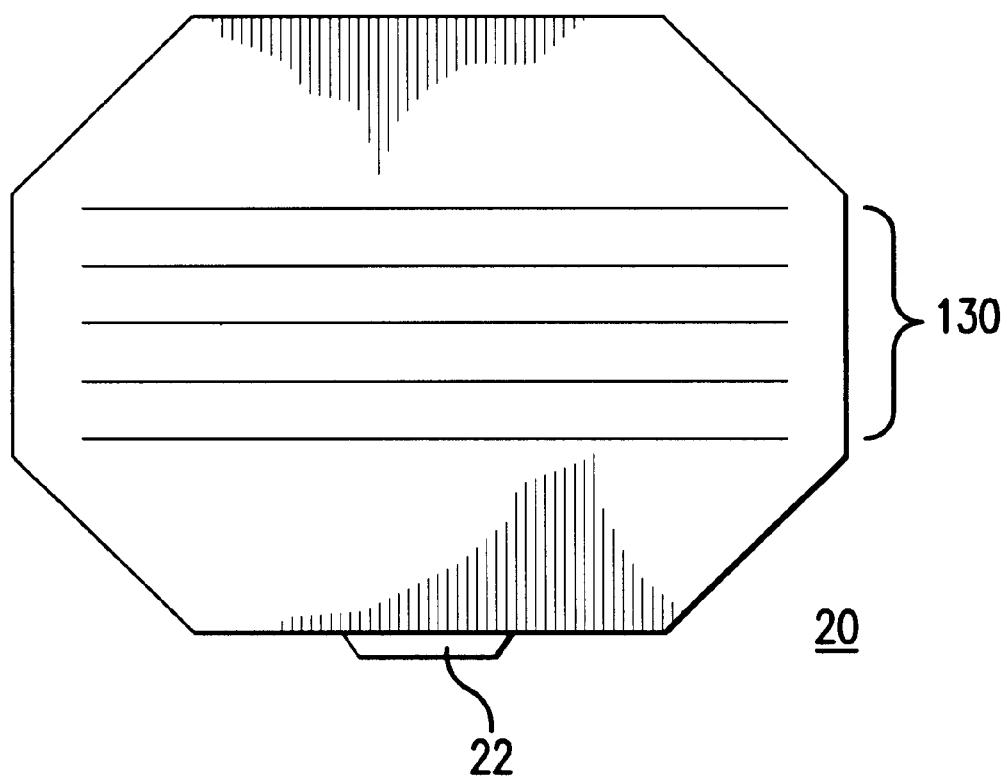
FIG. 8 is a top view showing the inventive universal handling container's lid section with optional reinforcing members.

FIG. 8 shows another alternative of the invention which are one or more reinforcing members 130. Such reinforcing members 130 strengthen the structural integrity of the handling container 10. The reinforcing members are preferably made from a rigid conductive material such as steel rods which may be inserted into the flutes of the corrugated plastic outer shell of the container. As shown in FIG. 8, the reinforcing members 130 are inserted into the flutes of the lid section 20. The reinforcing members 130 may also be inserted into any of the other sections such as the bottom 31 of base section 30.

FIGS. 7 and 8 also illustrate opening tab 22 which may be provided on the leading edge of the lid section 20. The opening tab 22 may be integrally formed with the lid section 20 or attached thereto with the integral forming being the preferred method of construction. The opening tab 22 provides a surface for a user to grad and manipulate while opening and closing the lid section 20.

The general types of materials used to construct the universal handling container 10 are a conductive structural material for the base section 30, hinge section 60 and lid section 20 and a conductive resilient material for the panels 44, 46, 48, 80 the blocks 40, projections 90 and adapters 100, 110. A variety of such materials exist and illustrative examples for the conductive structural material include conductive, corrugated plastic and conductive corrugated cardboard with plastic being preferred because of its better structural properties.

Illustrative examples of conductive resilient materials include closed cell conductive foams such as conductive cross-linked polyethylene foam and conductive cross-linked VA copolymer foam which is sold by, for example, Zotefoams under various trademarks. These materials are preferred and the cross-linked VA copolymer foam most preferred of their low-sloughing properties and because they are easily fabricated and heat moldable using standard equipment. Sloughing is primary concern, because, after all, the material is conductive and pieces that slough off can cause a short circuit in the ESD-sensitive module.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. A universal handling container for housing an ESD-sensitive component, comprising:

a base section including a bottom, a front, and a back;

a lid section having a shape substantially conforming to a shape of the bottom of said base section;

a hinge section joining the back of said base section and said lid section;

wherein an interior of the said base section has a shape divided into a middle portion and a pair of side portions on opposite sides of the middle portion;

panels lining an interior face of said lid section and interior faces of the bottom, front and back of said base section;

blocks substantially filling the two side portions of said base section;

a pair of recesses provided in top portions of said blocks; and a pair of projections affixed to the interior face of said lid section and opposite said pair of recesses;

said pair of recesses and said pair of projections having a shape and size so as to form a friction fit therebetween;

said base section, said lid section, and said hinge section being made of a conductive material; and said panels, said blocks, and said projections being made of a conductive, resilient material.

2. The universal handling container for housing an ESD-sensitive component according to claim 1, wherein said lid section and the bottom of said base portion both have an octagonal shape; and wherein the interior of said base section has an decahedral shape, the middle portion has a rectangular parallel piped shape and the two side sections each have a hexahedral shape.

3. The universal handling container for housing an ESD-sensitive component according to claim 2, the front and the back of said base section each having a rectangular main surface and a pair of wings disposed on opposite ends of the rectangular main surface, said wings being bent inwardly to conform to the octagonal shape of said lid section and the bottom of said base section.

4. The universal handling container for housing an ESD-sensitive component according to claim 1, said pair of recesses and said pair of projections each having a rectangular parallel piped shape of substantially the same size so as to form a friction fit therebetween.

5. The universal handling container for housing an ESD-sensitive component according to claim 1, further comprising:

a document holder having at least a top surface made of a transparent material, said document holder affixed to an outer surface of the universal handling container.

6. The universal handling container for housing an ESD-sensitive component according to claim 1, further comprising:

an opening tab formed on said lid section on a surface opposite said hinge section.

7. The universal handling container for housing an ESD-sensitive component according to claim 1, further comprising:

a conductive adapter having a size and shape to adapt interior dimensions of the universal handling container to exterior dimensions of the ESD-sensitive component.

8. The universal handling container for housing an ESD-sensitive component according to claim 7, further comprising:

said conductive adapter being removable from said base section.

9. The universal handling container for housing an ESD-sensitive component according to claim 7, further comprising:

said conductive adapter being affixed to at least one inside surface of said base section.

10. The universal handling container for housing an ESD-sensitive component according to claim 7, further comprising:

reinforcing members provided in at least one of said lid section and said base section.

11. The universal handling container for housing an ESD-sensitive component according to claim 1, said base section, said lid section and said hinge section being constructed from a structural sheet of conductive material.

12. The universal handling container for housing an ESD-sensitive component according to claim 1, said base section, said lid section and said hinge section being constructed from a single sheet of conductive material.

13. The universal handling container for housing an ESD-sensitive component according to claim 12, wherein the conductive material is a corrugated, conductive plastic material.

14. The universal handling container for housing an ESD-sensitive component according to claim 1, wherein said panels, said blocks, and said projections are made from a closed-cell conductive foam.

15. The universal handling container for housing an ESD-sensitive component according to claim 1, wherein said panels, said blocks, and said projections are made from a conductive cross-linked polyethylene foam or a conductive cross-linked VA copolymer foam.

* * * * *